US012724121B2

(12) United States Patent
Coffy et al.

(10) Patent No.: US 12,724,121 B2
(45) Date of Patent: Sep. 1, 2026

(54) TIME-OF-FLIGHT SENSOR

(71) Applicant: STMicroelectronics (Grenoble 2) SAS, Grenoble (FR)

(72) Inventors: Romain Coffy, Voiron (FR); Younes Boutaleb, Grenoble (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 649 days.

(21) Appl. No.: 18/112,087

(22) Filed: Feb. 21, 2023

(65) Prior Publication Data

US 2023/0266441 A1 Aug. 24, 2023

(30) Foreign Application Priority Data

Feb. 22, 2022 (FR) ...................................... 2201571

(51) Int. Cl.

*H01L 27/15* (2006.01)
*G01S 7/481* (2006.01)
*H01L 29/16* (2006.01)
*H01L 31/12* (2006.01)
*H01L 33/00* (2010.01)
*H10W 90/00* (2026.01)

(52) U.S. Cl.

CPC ........... *G01S 7/4813* (2013.01); *H10W 90/00* (2026.01)

(58) Field of Classification Search

CPC .... H10H 29/10–142; H10H 29/30–962; H10F 19/00–908; H10F 77/50; H10K 30/88

See application file for complete search history.

(56) References Cited

U.S. PATENT DOCUMENTS 10,177,268 B2 * 1/2019 Chen ..................... G01S 7/4813
2012/0104454 A1 * 5/2012 Coffy ................ G02B 13/0085 257/E33.059
2013/0264703 A1 * 10/2013 Tae .................. H01L 23/49811 257/737
2014/0231635 A1 * 8/2014 Kerness ............... H10F 77/331 250/226
2014/0346627 A1 * 11/2014 Yamada ................ H04N 23/54 257/431

(Continued)

FOREIGN PATENT DOCUMENTS

CN 105554418 A 5/2016
CN 112751618 A 5/2021
CN 219641923 U 9/2023

OTHER PUBLICATIONS

CN First Office Action and Search Report for counterpart CN Appl. No. 202310149113.7, report dated Mar. 31, 2025, 8 pgs.

(Continued)

*Primary Examiner* — Ismail A Muse
(74) *Attorney, Agent, or Firm* — Crowe & Dunlevy LLC

(57) ABSTRACT

A time-of-flight sensor includes a first light ray generation circuit and a second light ray reception circuit. A resin layer encapsulates the first light ray generation circuit and the second light ray reception circuit. A first region configured to emit light rays of the first light ray generation circuit is exposed at a surface of the resin layer. A second region configured to receive light rays of the second light ray reception circuit is also exposed at that surface of the resin layer. The surface of the resin layer is configured to be directed towards a scene.

15 Claims, 3 Drawing Sheets

(56) References Cited

U.S. PATENT DOCUMENTS

| | | | | |
|---|---|---|---|---|
| 2018/0182913 | A1* | 6/2018 | Chen | G01S 17/04 |
| 2019/0146069 | A1* | 5/2019 | Etschmaier | G02B 5/20 356/4.01 |
| 2019/0190606 | A1 | 6/2019 | Riviere et al. | |
| 2019/0191067 | A1 | 6/2019 | Vaillant et al. | |
| 2019/0356390 | A1* | 11/2019 | Coullomb | H04B 10/40 |
| 2020/0020622 | A1* | 1/2020 | Kaji | H01L 23/3735 |
| 2020/0020827 | A1 | 1/2020 | Ho et al. | |
| 2021/0080547 | A1 | 3/2021 | Luan | |
| 2021/0135069 | A1 | 5/2021 | Coffy et al. | |
| 2021/0242159 | A1* | 8/2021 | Teng | H01L 23/5386 |
| 2021/0373132 | A1 | 12/2021 | Etschmaier et al. | |
| 2022/0020885 | A1* | 1/2022 | Tsai | H01L 25/162 |

OTHER PUBLICATIONS

INPI Search Report and Written Opinion for priority application, FR 2201571, report dated Oct. 5, 2022, 9 pgs.

CN Notice of Allowance for counterpart CN Appl. No. 202310149113.7, report dated Aug. 25, 2025, 4 pgs.

* cited by examiner 10
20b
20a 22
30
44
16
34
47
14
40
18
32
13
42
12
46
22
38
22
36
22a
26
22b
24
20
28

TIME-OF-FLIGHT SENSOR

PRIORITY CLAIM

This application claims the priority benefit of French Application for Patent No. 2201571, filed on Feb. 22, 2022, the content of which is hereby incorporated by reference in its entirety to the maximum extent allowable by law.

TECHNICAL FIELD

The present disclosure generally concerns electronic devices and, in particular, time-of-flight sensors and their manufacturing methods.

BACKGROUND

A sensor operating on the time-of-flight principle, also referred to as a time-of-flight sensor (TOF), enables to accurately measure a distance in real time. To achieve this, TOF sensors illuminate the scene and the measured objects by a flash of light and calculate the time that this flash takes to travel between the object and the sensor. The time of flight of this flash is directly proportional to the distance between the sensor and the measured object.

There is a need in the art to address the disadvantages of known time-of-flight sensors.

SUMMARY

An embodiment provides a time-of-flight sensor comprising a first light ray generation circuit and a second light ray reception circuit, the first and second circuits being located in a first resin layer.

Another embodiment provides a method of manufacturing a time-of-flight sensor comprising forming, in a first resin layer, a first light ray generation circuit and a second light ray reception circuit.

According to an embodiment, a first region of the first circuit configured to emit the light rays and a second region of the second circuit configured to receive the light rays are flush with a same first surface of the first layer.

According to an embodiment, the first surface is configured to be directed towards a scene.

According to an embodiment, the first surface is covered with a first stack of insulating layers having first conductive tracks located therein, the first stack comprising first and second openings, the first opening at least partially exposing the first region and the second opening at least partially exposing the second region, at least some of the first tracks being in contact with the first circuit or the second circuit.

According to an embodiment, the sensor comprises a component resting on the first stack, the component comprising third and fourth openings inside of which are optical instruments, the optical instruments being at least partially located in front of the first and second regions.

According to an embodiment, the component is made of resin and each third and fourth opening comprises an edge having the optical instrument bonded thereon.

According to an embodiment, the first opening further exposes a third region of the second circuit configured to receive the light rays, the third region being flush with the first surface of the first layer, the third region being in front of a portion of the component.

According to an embodiment, a second surface of the first layer is covered with a second stack of insulating layers having second conductive tracks located therein.

According to an embodiment, the first layer comprises conductive vias coupling the first conductive tracks and the second conductive tracks and/or conductive vias coupling the first circuit or the second circuit and the second conductive tracks.

According to an embodiment, the method comprises bonding the first and second circuits and of the vias to a support.

According to an embodiment, the method comprises forming the first resin layer around the first and second circuits and the vias and on the support.

According to an embodiment, the first layer is formed by a method of panel embedded packaging (PEP) type.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms “front”, “back”, “top”, “bottom”, “left”, “right”, etc., or to relative positional qualifiers, such as the terms “above”, “below”, “upper”, “lower”, etc., or to qualifiers of orientation, such as “horizontal”, “vertical”, etc., reference is made to the orientation shown in the figures.

Unless specified otherwise, the expressions “around”, “approximately”, “substantially” and “in the order of” signify within 10%, and preferably within 5%.

Figure 1:
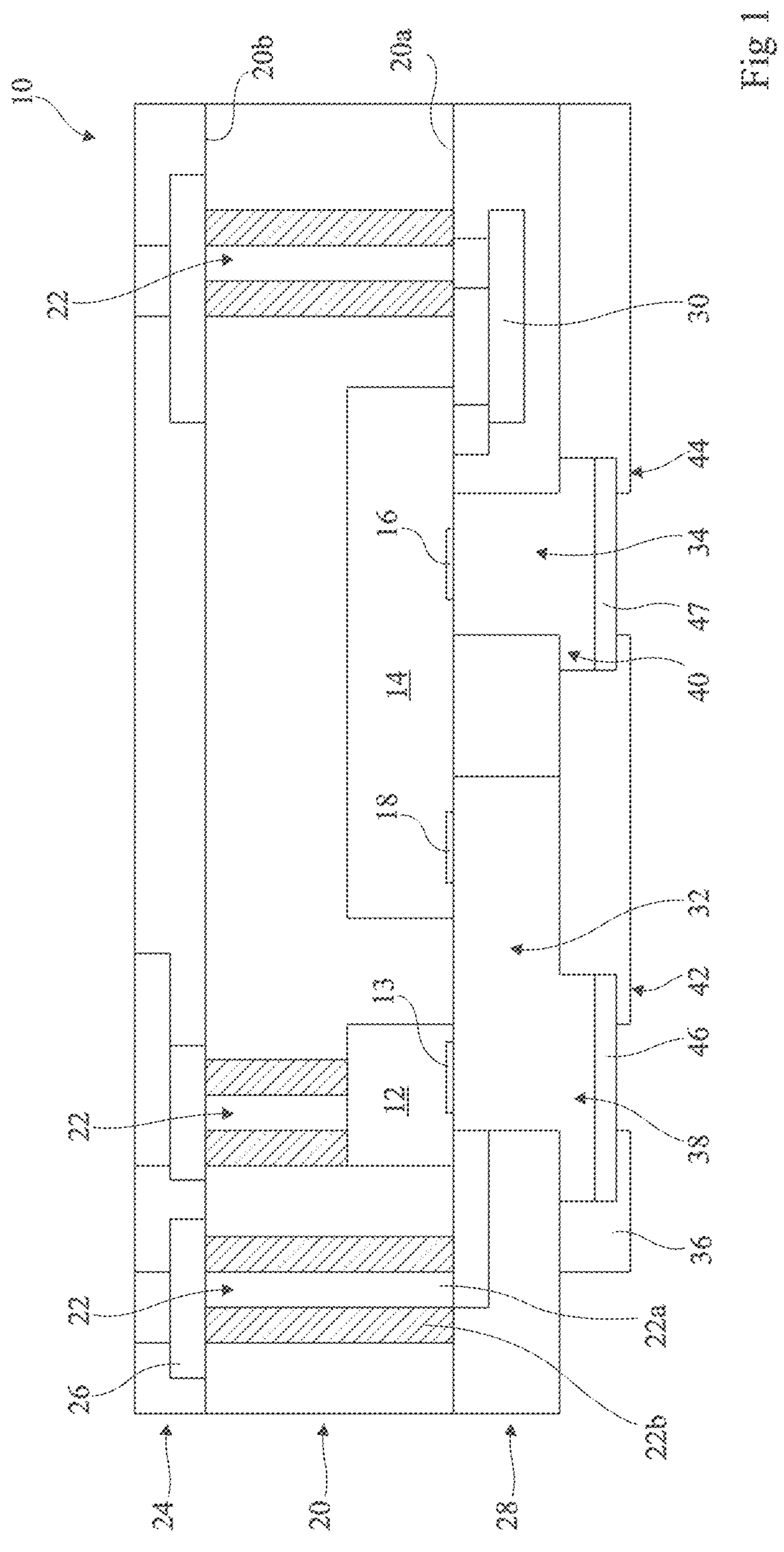
FIG. 1 shows an embodiment of a time-of-flight sensor.

FIG. 1 shows an embodiment of a time-of-flight sensor 10. In the case of FIG. 1, the main surface of the sensor, that is, the surface emitting and receiving rays, that is, the surface located on the side of (i.e., facing) a scene, the distance of which is desired to be determined, is the lower surface.

Sensor 10 comprises a circuit 12 of light generation, for example, of laser generation. Circuit 12 comprises one or a plurality of diodes, for example one or a plurality of light-emitting diodes, or one or a plurality of laser diodes. Circuit 12 comprises a light ray generation region 13. In other words, the light rays generated by circuit 12 are emitted at the level of region 13.

Sensor 10 comprises a circuit 14 for receiving said light generated by circuit 12. Circuit 14 comprises a light ray reception region 16. Region 16 is configured to receive the light rays generated by circuit 12 and reflected by the scene. Circuit 14 comprises another light ray reception region 18. Region 18 is configured to receive light rays generated by circuit 12 and reflected by portions of sensor 10.

Circuits 12 and 14 are located in (i.e., embedded within) a resin layer 20. The resin is preferably a resin adapted to the panel embedded packaging (PEP) technology. The resin is, for example, a so-called "thermosetting" epoxy resin. The resin is, for example, opaque to the wavelengths of the light rays emitted by circuit 12.

Layer 20 comprises a lower surface 20*a*, preferably planar, and an upper surface 20*b*, preferably planar. Lower surface 20*a* corresponds to the surface closest to (facing toward) the scene, that is, the surface closest to the side of the sensor emitting and receiving the light rays. Upper surface 20*b* corresponds to the surface most distant from (facing away from) the scene, that is, the surface most distant from the side of the sensor emitting and receiving the light rays.

Circuits 12 and 14 are located on the side of the lower surface of layer 20. A portion of each circuit 12, 14 is coplanar with surface 20*a*. In other words, circuits 12 and 14 are flush with the lower surface 20*a* of layer 20. More precisely, region 13 is flush with surface 20*a*, and is thus not covered with layer 20. Similarly, regions 16 and 18 of circuit 14 are flush with surface 20*a* and are thus not covered with layer 20. Regions 13, 16, and 18 are preferably coplanar.

The lateral walls of circuits 12, 14 are at least partially, preferably entirely, covered with, and in contact with, the resin of layer 20. The upper walls of circuits 12, 14 are at least partially covered with, and in contact with, the resin of layer 20. Chips 12, 14 are thus held in layer 20. Circuits 12 and 14 are, for example, separated from each other by a portion of layer 20.

The sensor may, for example, comprise one or a plurality of other circuits, not shown, in layer 20.

Sensor 10 further comprises conductive vias 22. In the example of FIG. 1, vias 22 each comprise a conductive core 22*a*, for example, made of metal, and a sheath 22*b* made of an electrically-insulating material. The sheath 22*b* of each via laterally surrounds the corresponding core 22*a*. Vias 22 each comprise an upper surface exposing core 22*a*. The upper surfaces of vias 22 are preferably coplanar.

Certain vias cross layer 20. Said vias, and particularly the cores 22*a* of said vias, extend from the lower surface of layer 20 to the upper surface of layer 20. Other vias, and particularly the cores 22*a* of said vias, extend from the upper surface of a circuit located in layer 20 to the upper surface of layer 20. In the example of FIG. 1, sensor 10 comprises two vias 22 extending from the lower surface of layer 20 to the upper surface of layer 20 and one via 22 extending from the upper surface of circuit 12 to the upper surface of layer 20. The core of the via 22 extending from the upper surface of circuit 12 is preferably in contact with circuit 12, and preferably with a connection pad, not shown, of FIG. 12.

Sensor 10 comprises a stack 24 of insulating layers comprising conductive tracks 26. The surface 20*b* of layer 20 is covered with stack 24 of insulating layers. Stack 24 covers vias 22. Preferably, stack 24 entirely covers the upper surface of layer 20. Each via 22 is in contact with a track 26. Each via 22 is coupled, via tracks 26, to another via 22 or to a track 26 exposed at the level of the upper surface of stack 24. The sensor can thus be coupled to external elements by tracks 26.

The sensor further comprises a stack 28 of insulating layers comprising conductive tracks 30. Stack 28 covers surface 20*a* of layer 20. Stack 28 covers, in particular, the vias 22 extending all the way to surface 20*a*. Stack 28 is located between layer 20 and the scene towards which the rays are emitted.

Stack 28 comprises an opening 32 located in front of, that is, vertically aligned with, region 13. Opening 32 crosses stack 28. In other words, opening 32 extends from the upper surface of stack 28 to the lower surface of stack 28. Opening 32 partially exposes circuit 12. Opening 32 at least partially exposes region 13, preferably entirely exposes region 13. Preferably, at least a portion of circuit 12 is not exposed by opening 32 and is covered with stack 28.

Preferably, a portion of circuit 12, for example, a portion of the lower surface of circuit 12, for example, a connection pad, not shown, is in contact with a conductive track 30 located in stack 28. Said track 30 is, for example, coupled to a via 22, more precisely to a core 22*a* of via 22, for example, directly or via other tracks 30.

A connection terminal of circuit 12 is thus, for example, coupled to a track 26 exposed at the level of the upper surface of the sensor by a via 22 and by tracks 26. Another connection terminal of circuit 12 is, for example, coupled to a track 26 exposed at the level of the upper surface of the sensor by one or a plurality of tracks 30, a via 22, and tracks 26. It is thus possible to electrically couple circuit 12 to external elements by the upper surface of sensor 10.

In the example of FIG. 1, opening 32 further extends in front of at least a portion of the region 18 of circuit 14, preferably in front of the entire region 18. Opening 32 thus also covers the portion of layer 20 separating circuits 12 and 14. Regions 13 and 18 are thus exposed by a same opening.

Stack 28 comprises another opening 34 located in front of region 16. Opening 34 crosses stack 28. In other words, opening 34 extends from the upper surface of stack 28 to the lower surface of stack 28. Opening 34 partially exposes circuit 14. Opening 34 at least partially exposes region 16, preferably entirely exposes region 16. Preferably, at least a portion of circuit 14 is not exposed by opening 34 and is covered with stack 28.

Preferably, a portion of circuit 14, for example, a portion of the lower surface of circuit 14, for example, a connection pad, not shown, is in contact with a conductive track 30 located in stack 28. Said track 30 is, for example, coupled to a via 22, more precisely to a core 22*a* of via 22, for example, directly or via other tracks 30.

A connection terminal 14 is, for example, coupled to a track 26 exposed at the level of the upper surface of the sensor by one or a plurality of tracks 30, a via 22, and tracks 26. It is thus possible to electrically couple circuit 12 to external elements by the upper surface of sensor 10.

Openings 32 and 34 are separated by a portion of stack 28. The material(s) of stack 28, in particular the materials located in the portion separating openings 32 and 34, are opaque at least to the wavelengths of the light rays emitted by circuit 12.

Sensor 10 further comprises a component 36 bonded to stack 28. Component 36 is more precisely bonded to the lower surface of stack 28. Component 36 is located between stack 28 and the scene. Component 36 is, for example, made of resin, for example, of the same resin as layer 20. Component 36 is preferably made of a material at least partially opaque, preferably totally opaque, to the wavelengths emitted by circuit 12.

Component 36 comprises openings 38 and 40. Each opening 38, 40 comprises a first portion located on the side closest to stack 28 and a second portion located on the side most distant from stack 28. The horizontal dimensions, that is, in a plane parallel to the lower surface of layer 20, of the first portion of each opening 38, 40, are greater than the horizontal dimensions of the second portion of the same opening. Thus, the horizontal dimensions of the first portion of opening 38 are smaller than the horizontal dimensions of the second portion of opening 38. Similarly, the horizontal dimensions of the first portion of opening 40 are greater than the horizontal dimensions of the second portion of opening 38. Opening 38, respectively opening 40, thus comprise an edge 42, respectively an edge 44.

Sensor 10 further comprises optical instruments (for example, optical elements) 46 and 47. Optical instruments 46 and 47 are, for example, optical filters. Instruments 46 and 47 are located in openings 38, 40. More precisely, instrument 46 is located in opening 38, more precisely in the first portion of opening 38. Instrument 46 rests on edge 42. Preferably, instrument 46 is bonded to edge 42, for example, by a glue layer not shown. Similarly, instrument 47 is located in opening 40, more precisely in the first portion of opening 40. Instrument 47 rests on edge 44. Preferably, instrument 47 is bonded to edge 44, for example, by a glue layer not shown.

Instruments 46, 47 thus have horizontal dimensions smaller than or equal to the horizontal dimensions of the first portion of the opening where they are located. Instruments 46, 47 thus have horizontal dimensions greater than the horizontal dimensions of the second portion of the opening where they are located. The thickness of instruments 46, 47 is smaller than or equal to, preferably smaller than, the height of the first portion of the opening where they are located.

Opening 40, and instrument 47, are located in front of opening 34, preferably of the entire opening 34. In other words, opening 40, and instrument 47, are located in front of a portion of circuit 14, in particular in front of region 16. The first portion of opening 40 is preferably located in front of the entire region 16. Preferably, the second portion of opening 40 is located in front of the entire region 16.

Opening 38, and instrument 46, are located in front of at least a portion of opening 32. Opening 38, and instrument 46, are located in front of at least a portion of circuit 12, in particular in front of region 13. The first portion of opening 38 is preferably located in front of the entire region 13. Preferably, the second portion of opening 38 is located in front of the entire region 13. Preferably, opening 38 is not located in front of region 18. Thus, region 18 is preferably entirely located in front of a portion of component 36.

During the operation of the sensor, light rays are emitted by circuit 12, more particularly by region 13 of circuit 12. A first part of these rays is reflected on component 36 and on instrument 46 and is received by region 18. A second part of these rays, preferably corresponding to a majority of the rays, crosses opening 38 and crosses instrument 46 to reach the scene. The second portion of the rays is reflected on the scene and towards the sensor. The second part of the rays crosses opening 40, and in particular instrument 47, to reach region 16.

FIGS. 2 to 5 illustrate steps, preferably successive, of a method of manufacturing the embodiment of FIG. 1. Although FIGS. 2 to 5 illustrate the forming of a single device, a plurality of identical devices may be formed simultaneously, for example, on a same wafer and then separated from each other using a singulation operation.

Figure 2:
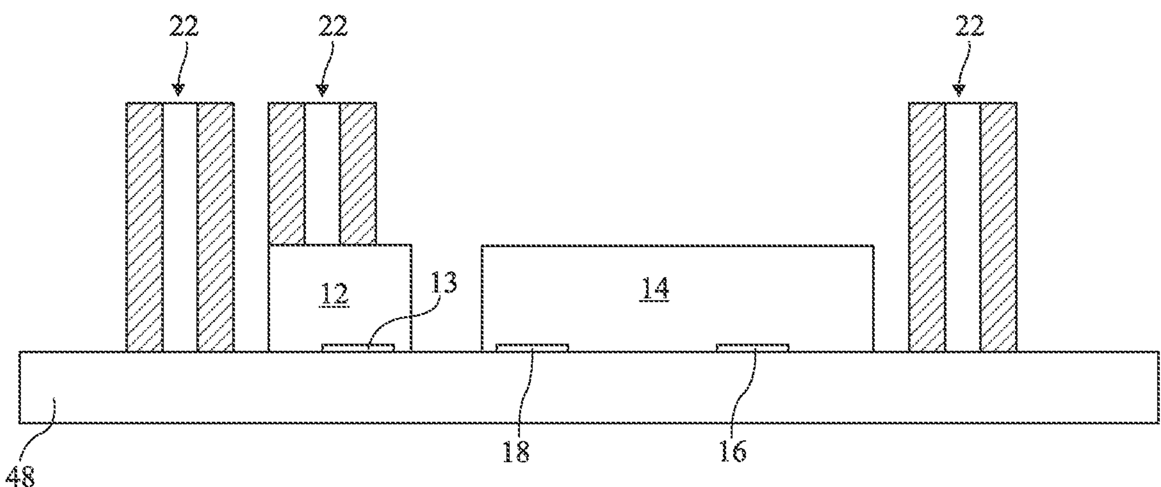
FIG. 2 shows a cross-section view of a step of manufacturing of the embodiment of FIG. 1.

FIG. 2 shows a cross-section view of a step of manufacturing of the embodiment of FIG. 1.

During this step, circuits 12 and 14 are bonded to a temporary substrate 48.

Similarly, vias 22 are bonded to support 48. Circuits 12, 14, and vias 22 are, for example, bonded to support 48 by an adherent glue layer located on support 48.

Circuits 12, 14 and the vias are placed at locations corresponding to their arrangement in the sensor 10 of FIG. 1, support 48 being located on the lower surface side of sensor 10. Thus, circuits 12, 14 are bonded in such a way that regions 13, 16, and 18 are located towards support 48, preferably in contact with support 48. Further, the vias 22 corresponding to the vias 22 of FIG. 1 extending from the lower surface of layer 20 to the upper surface of layer 20 are bonded to support 48, preferably in contact with support 48. The vias 22 corresponding to the vias 22 of FIG. 1 extending from the upper surface of layer 20 to the circuits, in particular to circuit 12, are bonded to said circuits.

Support 48 is sufficiently strong to hold circuits 12, 14 and vias 22 at the locations at which they are placed.

Figure 3:
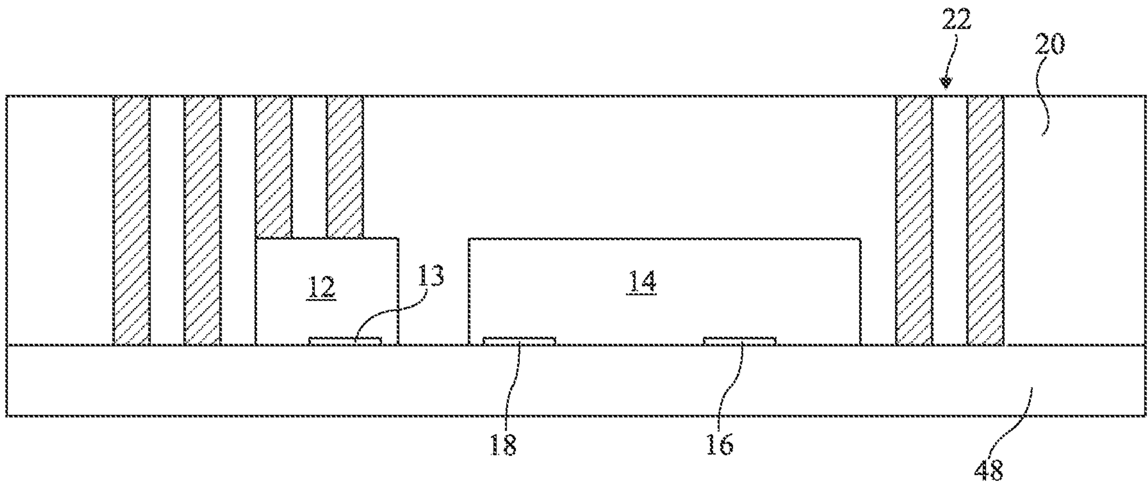
FIG. 3 shows a cross-section view of another step of manufacturing of the embodiment of FIG. 1.

FIG. 3 shows a cross-section view of another step of manufacturing of the embodiment of FIG. 1.

During this step, layer 20 is formed. Layer 20 is formed on the upper surface of support 48, that is, the surface having vias 22 and circuits 12 and 14 bonded thereto. The upper surface of layer 20 is, for example, planar. The upper surface of layer 20 is located at the level of the upper surface of vias 22. The upper surface of layer 20 and the upper surfaces of vias 22 are thus coplanar. The upper surfaces of vias 22, and more precisely of cores 22*a*, are thus exposed. Layer 20 covers, as previously described, circuits 12 and 14 and covers the lateral walls of vias 33.

For example, layer 20 is formed by a method of panel embedded packaging (PEP) type. For example, a panel, not shown, is placed on the structure of FIG. 2. The panel, not shown, is, for example, in contact with the upper surfaces of vias 22. Thus, the space between the panel, not shown, and support 48 corresponds to the location of layer 20. The space between the panel, not shown, and support 48 is then filled with a resin, for example, liquid resin. The resin is then heated to be solidified and to take the shape of layer 20. The panel, not shown, is then removed.

The presence of the panel, not shown, placed against the upper surfaces of vias 22 enables to ensure that the upper surfaces of the vias are not covered with the resin.

Figure 4:
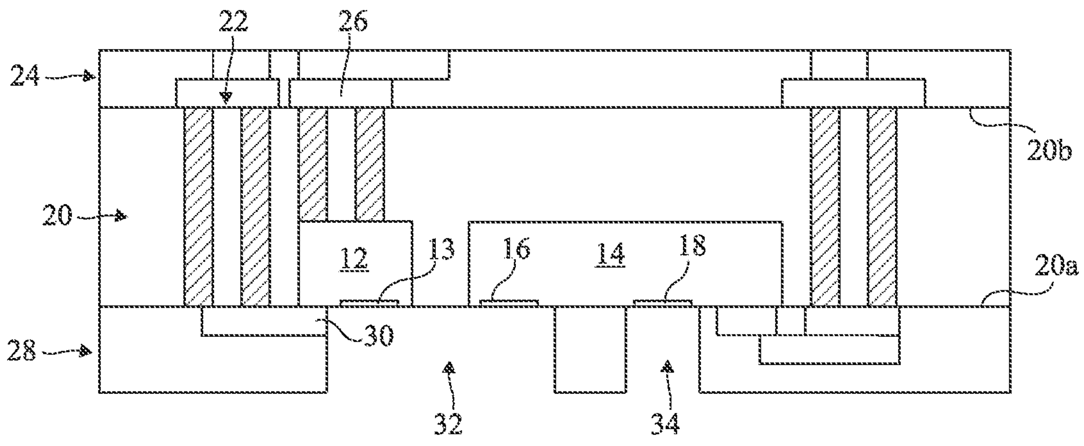
FIG. 4 shows a cross-section view of another step of manufacturing of the embodiment of FIG. 1.

FIG. 4 shows a cross-section view of another step of manufacturing of the embodiment of FIG. 1.

During this step, support 48 is removed and stacks 24 and 28 are formed with tracks 26 and 30.

Stacks 24 and 28 are preferably formed independently. For example, the step of FIG. 4 comprises the removal of support 48, the forming of one of the stacks, for example, the forming of stack 24 and of tracks 26, and then the forming of the other stack, for example, the forming of stack 28 and of tracks 30. As a variant, support 48 may be removed after the forming of stack 24 and before the forming of stack 28.

The forming of a stack 24, 28 and of the corresponding conductive tracks 26, 30 for example comprises the forming of each layer of the stack, the etching of said layer at the location of the track, and the filling of said location with a conductive material, for example, a metal.

As a variant, the forming of a stack 24, 28 and of the corresponding conductive tracks 26, 30 comprises, for example, the forming of the conductive tracks of a level, for example, by growth of the metal, and then the filling of the level with an insulating material.

Openings 32 and 34 are, for example, formed by etching in stack 28 after its forming. As a variant, the locations of the openings may be filled with temporary filling materials selectively etchable over the materials of stack 28, that is, the materials of the layers of the stack and the materials of tracks 30. The temporary materials are removed after the forming of stack 28 to expose the opening.

Figure 5:
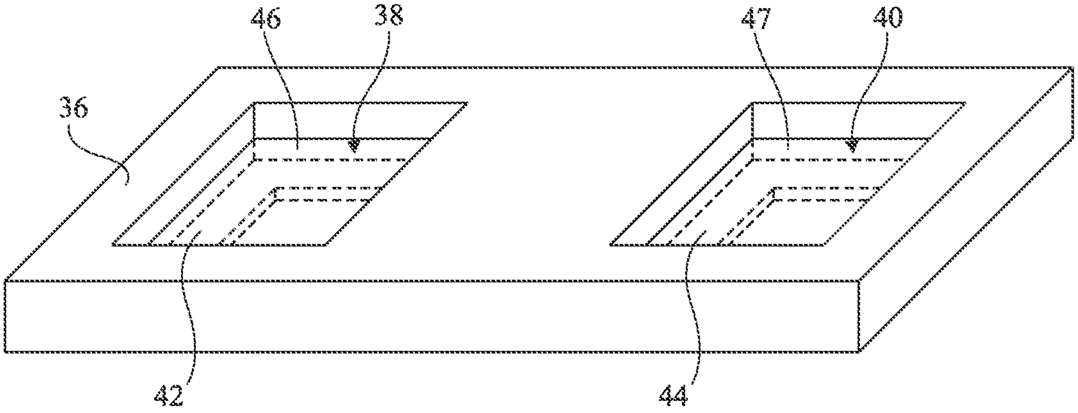
FIG. 5 shows a perspective view of another step of manufacturing of the embodiment of FIG. 1.

FIG. 5 shows a perspective view of another step of manufacturing of the embodiment of FIG. 1.

The step of FIG. 5 illustrates the forming of component 36 and of optical instruments 46, 47. This step is, for example, carried out independently from the steps of FIGS. 2 to 4. Thus, the step of FIG. 5 may be carried out before the steps of FIGS. 2 to 4, after the steps of FIGS. 2 to 4, or simultaneously.

During this step, component 36 is formed, for example, by molding of the resin. Component 36 is thus formed of a single block of molded resin. Component 36 is thus formed to have openings 38 and 40, and to form edges 42 and 44.

Optical instruments 46 and 47 are then placed and bonded in openings 38 and 40, on edges 42, 44.

After the steps of FIGS. 2 to 5, the method comprises a step of bonding component 36 to stack 28.

An advantage of the described embodiments is that they enable ray emission and reception regions 13 and 16, 18 to be coplanar.

Another advantage of the described embodiments is that the sensor is compact and resistant, the circuits being protected by the resin.

Various embodiments and variants have been described. Those skilled in the art will understand that certain features of these various embodiments and variants may be combined, and other variants will occur to those skilled in the art. In particular, the connections of circuits 12 and 14 may be different. For example, the connections of circuit 14 may be performed by the upper surface of the circuit, that is, for example, by a via 22 and tracks 26, and possibly by vias in the chip, without tracks 30.

Further, component 36 may be replaced with another component enabling to close openings 32, 34 and enabling to hold optical instruments. Component 36 may for example be replaced with a component made of another material.

Finally, the practical implementation of the described embodiments and variations is within the abilities of those skilled in the art based on the functional indications given hereabove.

The invention claimed is:

1. A time-of-flight sensor, comprising:

a light ray generation circuit including a first region configured to emit light rays;

a light ray reception circuit including a second region configured to receive light rays and a third region configured to receive light rays; and a first resin layer encapsulating the light ray generation circuit and the light ray reception circuit, said first resin layer having a first surface and a second surface opposed to the first surface;

said first, second and third regions being flush with the first surface of the first resin layer;

wherein said first region, second region and third region are exposed at the first surface of the first resin layer;

wherein said first surface of the first resin layer is configured to be directed towards a scene;

a first stack of insulating layers covering the first surface of the first resin layer;

wherein the first stack of insulating layers includes a first opening exposing both the first region and the third region and further includes a second opening exposing the second region;

a component resting on the first stack of insulating layers;

said component comprising a third opening coupled to the first opening and a fourth opening coupled to the second opening;

wherein a portion of the component extends over the third region;

first conductive tracks located in said first stack of insulating layers;

wherein said first conductive tracks are in contact with one or more of the light ray generation circuit and the light ray reception circuit;

a second stack of insulating layers covering the second surface of the first resin layer;

second conductive tracks located in said second stack of insulating layers; and conductive vias within the first resin layer;

wherein said conductive vias electrically couple between the first conductive tracks and the second conductive tracks.

2. The sensor according to claim 1, further comprising:

a first optical instrument bonded in the third opening and positioned at least partially located in front of the first region of the light ray generation circuit; and a second optical instrument bonded in the fourth opening and positioned at least partially located in front of the second region of light ray reception circuit.

3. The sensor according to claim 2, wherein the component is made of resin and wherein each of the third and fourth openings includes an edge to which the first and second optical instruments, respectively, are bonded.

4. A time-of-flight sensor, comprising:

a light ray generation circuit including a first region configured to emit light rays;

a light ray reception circuit including a second region configured to receive light rays and a third region configured to receive light rays; and a first resin layer encapsulating the light ray generation circuit and the light ray reception circuit, said first resin layer having a first surface and a second surface opposed to the first surface;

said first, second and third regions being flush with the first surface of the first resin layer;

wherein said first region, second region and third region are exposed at the first surface of the first resin layer;

wherein said first surface of the first resin layer is configured to be directed towards a scene;

a first stack of insulating layers covering the first surface of the first resin layer;

wherein the first stack of insulating layers includes a first opening exposing both the first region and the third region and further includes a second opening exposing the second region;

a component resting on the first stack of insulating layers;

said component comprising a third opening coupled to the first opening and a fourth opening coupled to the second opening; and wherein a portion of the component extends over the third region;

first conductive tracks located in said first stack of insulating layers;

wherein said first conductive tracks are in contact with one or more of the light ray generation circuit and the light ray reception circuit;

a second stack of insulating layers covering the second surface of the first resin layer;

second conductive tracks located in said second stack of insulating layers; and conductive vias within the first resin layer;

wherein said conductive vias electrically couple one or more of the light ray generation circuit and the light ray reception circuit to the second conductive tracks.

5. The sensor according to claim 4, further comprising:

a first optical instrument bonded in the third opening and positioned at least partially located in front of the first region of the light ray generation circuit; and a second optical instrument bonded in the fourth opening and positioned at least partially located in front of the second region of light ray reception circuit.

6. The sensor according to claim 5, wherein the component is made of resin and wherein each of the third and fourth openings includes an edge to which the first and second optical instruments, respectively, are bonded.

7. A method of manufacturing a time-of-flight sensor, comprising:

bonding a light ray generation circuit and a light ray reception circuit to a surface of a support;

wherein a first region configured to emit light rays of said light ray generation circuit faces said surface;

wherein a second region and a third region configured to receive light rays of said light ray reception circuit faces said surface;

forming a first resin layer on said support which encapsulates the light ray generation circuit and the light ray reception circuit;

detaching the support to provide the first resin layer with a first surface and a second surface opposed to the first surface;

wherein said first region, second region and third region are exposed at the first surface of the first resin layer;

wherein said first surface of the first resin layer is configured to be directed towards a scene;

forming a first stack of insulating layers covering the first surface of the first resin layer;

forming a first opening in said first stack of insulating layers which exposes both the first region of the first light ray generation circuit and the third region of the light ray reception circuit;

forming a second opening in said first stack of insulating layers which exposes the second region of the light ray reception circuit;

forming a component resting on the first stack of insulating layers;

forming a third opening in said component coupled to the first opening, wherein the third opening is positioned at least partially located in front of the light ray generation circuit;

forming a fourth opening in said component coupled to the second opening, wherein the fourth opening is positioned at least partially located in front of the light ray reception circuit;

wherein a portion of the component extends over the third region.

8. The method according to claim 7, wherein forming the first layer comprises forming by a method of panel embedded packaging type.

9. The method according to claim 7, further comprising:

said first stack of insulating layers including first conductive tracks; and electrically connecting said first conductive tracks with one or more of the light ray generation circuit and the light ray reception circuit.

10. The method according to claim 9, further comprising:

forming a second stack of insulating layers covering the second surface of the first resin layer, said second stack of insulating layers including second conductive tracks.

11. The method according to claim 10, further comprising:

forming conductive vias within the first resin layer;

said conductive vias coupling between the first conductive tracks and the second conductive tracks.

12. The method according to claim 10, further comprising:

forming conductive vias within the first resin layer;

said conductive vias coupling one or more of the light ray generation circuit and the light ray reception circuit to the second conductive tracks.

13. The method according to claim 7, further comprising:

mounting a first optical instrument in the third opening; and mounting a second optical instrument in the fourth opening.

14. The method according to claim 13, wherein the third and fourth openings each comprise an edge, and wherein mounting the first and second optical instruments comprises bonding the first and second optical instruments to the edges in the third and fourth openings, respectively.

15. The method according to claim 7, wherein the component is made of resin.

* * * * *